United States Patent
Lai et al.

(10) Patent No.: US 6,251,799 B1
(45) Date of Patent: Jun. 26, 2001

(54) METHOD TO PROVIDE LOW DIELECTRIC CONSTANT VOIDS BETWEEN ADJACENT CONDUCTING LINES IN A SEMICONDUCTOR DEVICE

(75) Inventors: Wei-Sheng Lai, Chu-Pei; Yu-Ching Chang, Hsin-Chu; Chun-Hu Ge, Hsin-Dien; Chih-Ming Chen, Yam Mei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/356,004

(22) Filed: Jul. 16, 1999

(51) Int. Cl.[7] .................................................. H01L 21/31
(52) U.S. Cl. ........................................ 438/760; 438/761
(58) Field of Search .................................... 438/758, 760, 438/761

(56) References Cited

U.S. PATENT DOCUMENTS

| | | | |
|---|---|---|---|
| 5,119,164 | 6/1992 | Sliwa, Jr. et al. | 357/54 |
| 5,192,715 | 3/1993 | Sliwa, Jr. et al. | 437/195 |
| 5,270,267 | * 12/1993 | Ouellet | 438/624 |
| 5,599,745 | 2/1997 | Reinberg | 437/195 |
| 5,641,712 | 6/1997 | Grivna et al. | 438/624 |
| 5,665,657 | 9/1997 | Lee | 438/624 |
| 5,728,631 | 3/1998 | Wang | 438/787 |
| 5,792,705 | * 8/1998 | Wang et al. | 438/264 |

OTHER PUBLICATIONS

Furusawa et al., "Low Capacitance Multilevel Interconnection Using Low–E Organic Spin–On Glass for Quarter–Micron High–Speed ULSIs" 1995 Symposium on VLSI Technology Digest of Technical Papers, pp. 59–60.
Luo et al., "Effect of Air Gap on Measurement Accuracy of Dielectric Constant", IEEE 1996 0–7803–3216–4.

\* cited by examiner

Primary Examiner—Charles Bowers
Assistant Examiner—William M. Brewster
(74) Attorney, Agent, or Firm—George O. Saile; Stephen B. Ackerman; Rosemary L. S. Pike

(57) ABSTRACT

A method to provide low dielectric constant voids between adjacent conducting lines in a semiconductor device. Narrowly spaced metal lines are formed on the substrate surface. A dielectric layer is deposited overlying the metal lines and the substrate surface. A high water content, water saturated, environment is created for the spin-on-glass process. A pseudo-water condition exists on the surface of the dielectric layer prior to the deposition of the spin-on-glass layer. The spin-on-glass layer is deposited overlying the dielectric layer. Voids form in the spin-on-glass layer between the narrowly spaced metal lines. The spin-on-glass layer is baked. The integrated circuit device is completed.

20 Claims, 4 Drawing Sheets

METHOD TO PROVIDE LOW DIELECTRIC CONSTANT VOIDS BETWEEN ADJACENT CONDUCTING LINES IN A SEMICONDUCTOR DEVICE

BACKGROUND OF THE INVENTION (1) Field of the Invention

The present invention relates to the fabrication of semiconductor devices, and more particularly, to a method to provide low dielectric voids between adjacent conducting lines in the manufacture of integrated circuits.

(2) Description of the Prior Art

Feature size reduction is essential for realizing increased device content and higher switching speeds on integrated circuits. Reducing the spacing between conducting lines in a circuit, however, can result in an increase in capacitive coupling and subsequent crosstalk between these lines. In a crosstalk situation, a voltage on one conductor can affect the voltage on another conductor. In the worst case, data signals on the conductive lines can become so corrupted that correct operation of the integrated circuit at high speed becomes impossible.

The amount of capacitive coupling between adjacent conductors is directly related to the dielectric constant of the material between the conductors. In addition, as the distance between the conductors is reduced, the capacitive coupling increases exponentially. Clearly, a key to manufacturing integrated circuits with very close conductive line spacings is to reduce the dielectric constant of the isolating material between adjacent conductive lines.

FIG. 1 illustrates the capacitive coupling problem in the prior art. A semiconductor substrate 10 is shown. This substrate represents all of the layers and devices formed underlying the first metal conductors 12. The metal has been etched to form closely spaced metal conductors 12 (for example, a space of less than 0.5 microns). A first layer of plasma enhanced oxide (PEOX) 14 has been deposited overlying the first metal conductors and the substrate. The first PEOX layer 14 typically forms overhangs on the vertical sides of the first metal runners as shown. A layer of spin-on-glass (SOG) 16 has been deposited overlying the first PEOX layer 14. A second PEOX layer 18 has been formed overlying the SOG layer 16. A via is shown etched through layers 18, 16, and 14 to the upper surface of one of the first metal conductors 12. A second metal layer 20 has been deposited and etched to define a contact to the first metal runner 12. Finally, a passivation layer 26 has been deposited overlying the second metal layer 20 and the second PEOX layer 18.

Specifically note the region 24 in the SOG layer 16 between the two metal conductors 12. Capacitive coupling between the two metal lines 12 occurs through region 24 as the lines are routed in parallel across the surface of the substrate 10. For standard SOG material, the dielectric constant ($\in$) will be greater than 4. In the paper, "Low Capacitance Multilevel Interconnection Using Low-$\in$ Organic Spin-On Glass for Quarter-Micron High-Speed ULSIs," by Furusawa et al, for the 1995 Symposium on VLSI Technology Digest of Technical Papers, pp. 59–60, a low-$\in$SOG material is disclosed with a dielectric constant of 3.0. For the prior art method, the capacitance coupling can be reduced in this fashion but it is still too high.

In the paper IEEE 1996 0-7803-3216-4, "Effect of Air Gap on Measurement Accuracy of Dielectric Constant," by Lou et al, the problem of air gaps between material and conductor in the measurement of dielectric constant is discussed. Air has a low dielectric constant ($\in=1.0$). It is shown in the paper that the presence of air gaps can significantly reduce measured dielectric constants. In an integrated circuit application, such an air gap could be purposefully used to fill a part of the space between adjacent metal lines. Such an air gap inclusion would then reduce the effective dielectric constant and the capacitive coupling between the metal lines.

Several prior art approaches attempt to reduce the capacitive coupling between adjacent metal traces or to address particular problems associated with voids formed in the SOG material. U.S. Pat. No. 5,599,745 to Reinberg et al teaches a method to form air voids between closely spaced adjacent conductive lines by applying low melting point materials above the conductive lines. The low melting point materials are heated to cause a sagging overhanging layer on the sidewalls of the conductive lines that will then seal over air voids between the conductors. U.S. Pat. No. 5,665,657 to Lee teaches a method to remove voids unintentionally formed in the SOG layer by using an etch and fill method. U.S. Pat. Nos. 5,192,715 and 5,119,164 to Silwa, Jr. et al teach a method to form interfacial lateral sidewall voids by depositing tungsten and SOG overlying conductive traces. U.S. Pat. No. 5,728,631 to Wang teaches a method to form low capacitance dielectric air gaps between adjacent metal lines by using an electrocyclotron resonance (ECR) etching and deposition technique. U.S. Pat. No. 5,641,712 to Grivna et al teaches the formation of air gaps between interconnect lines by using a sputter etch technique on a plasma oxide layer.

SUMMARY OF THE INVENTION

A principal object of the present invention is to provide an effective and very manufacturable method of fabricating integrated circuits in which voids are formed in the inter-metal dielectric layer between narrowly-spaced adjacent conductive lines.

A further object of the present invention is to provide a method of forming voids in an inter-metal dielectric layer between narrowly spaced adjacent conductive lines to reduce capacitive coupling.

A yet further object of the present invention is to provide a method of forming voids in an inter-metal dielectric layer between narrowly-spaced adjacent conductive lines while using conventional SOG material and equipment.

In accordance with the objects of this invention, a new method for fabricating an integrated circuit in which an inter-metal dielectric is formed to include voids between narrowly spaced conductive lines is achieved. This method reduces capacitive coupling between the conductive lines. A semiconductor substrate is provided having narrowly spaced first conductive lines. A first dielectric layer is formed overlying the first conductive lines and the substrate. A first coating of spin-on-glass is deposited in a water rich environment. Air voids are formed in the SOG layer between the spaced first conductive lines as the first SOG layer is deposited and hard baked. A second SOG coating is deposited, hard baked and cured. The SOG layer is then is etched back to planarize the surface. A second dielectric layer is formed overlying the SOG layer. Via openings are etched through the first and second dielectric layers and the SOG layer to the top surface of the first conductive lines. A second conductive layer is deposited filling the via openings and overlying the second dielectric layer. The second conductive layer is patterned and etched to define useful traces.

A passivation layer is deposited overlying the metal layer and the interlevel dielectric. The integrated circuit is completed.

BRIEF DESCRIPTION OF THE DRAWINGS

In the accompanying drawings forming a material part of this description, there is shown.

DESCRIPTION OF THE PREFERRED EMBODIMENTS

Figure 1:
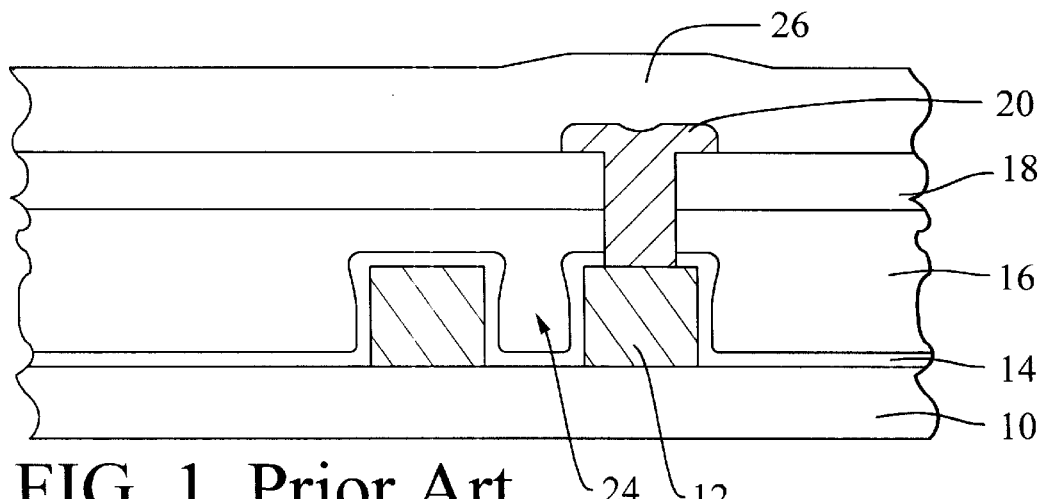
FIG. 1 schematically illustrates in cross-section a partially completed prior art integrated circuit showing a conventional form of the inter-metal dielectric and SOG layers.
Figure 2:
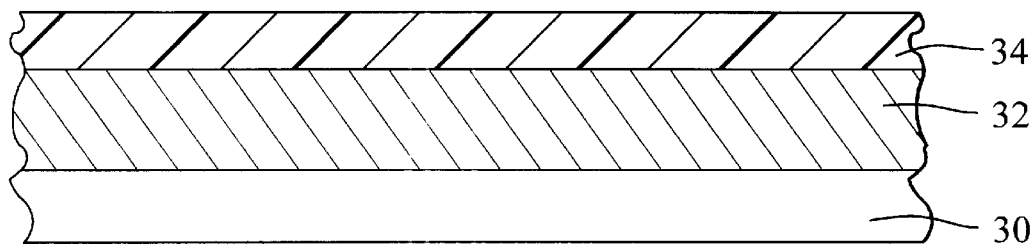
FIGS. 2 through 7 schematically illustrate in cross-sectional representation the present invention.

Referring now more particularly to FIG. 2, there is illustrated a portion of a partially completed integrated circuit. Area 30, which will be called the substrate, represents all layers of a processed silicon wafer disposed prior to a first metal layer 32. This first metal 32 is deposited by conventional means, such as CVD or sputtering, to a thickness of between about 3,700 Angstroms and 4,300 Angstroms. A photoresist layer 34 is deposited overlying the first metal layer 32.

Figure 3:
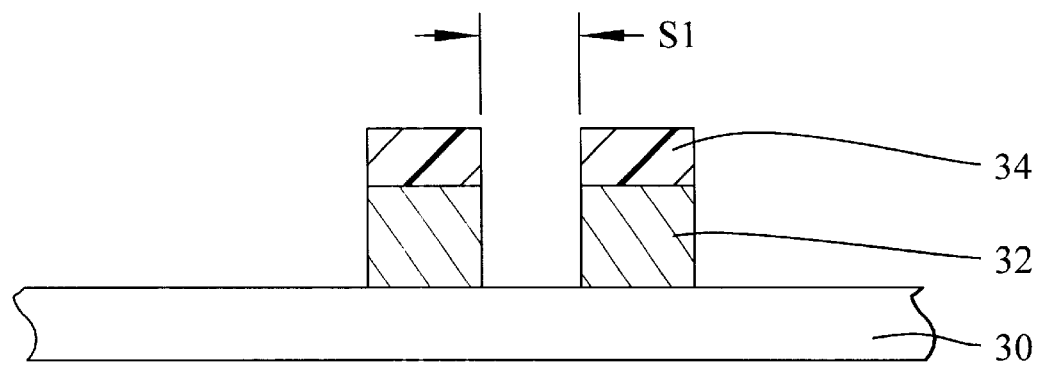

Referring to FIG. 3, the photoresist layer 34 is subjected to a conventional photolithographic step whereby the photoresist is patterned and part of it is removed. The remaining photoresist acts as a mask to prevent etching of the first metal layer 32 in selected locations. The metal is then conventionally etched to form the traces as depicted in FIG. 3.

The minimum spacing S1 between metal traces 32 is a critical parameter in this present invention. As stated earlier, as the spacing between metal lines decreases, the capacitive coupling increases exponentially. The present invention is designed to create air voids to reduce this capacitive coupling for conditions where S1 is less than 0.5 microns.

Figure 4:
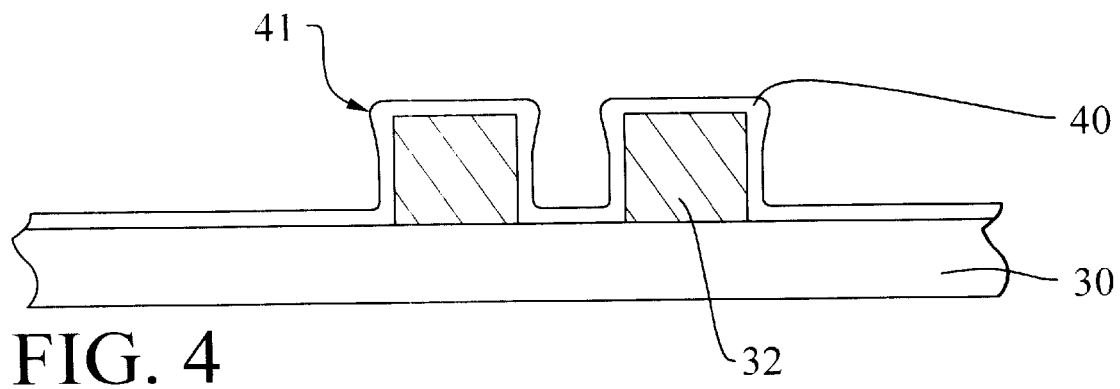

Referring now to FIG. 4, the remaining photoresist layer 34 is removed. Next, a first dielectric layer 40 is formed overlying the first metal lines 32 and the substrate 30. The first dielectric layer 40 is a plasma enhanced oxide (PEOX) and can be formed by plasma enhanced chemical vapor deposition (PECVD) or as plasma enhanced TEOS oxide. The first dielectric layer is preferably formed by a PECVD technique using silane as a source gas and nitrous oxide as a carrier gas. The first dielectric layer is formed to a thickness of between about 1,900 Angstrom and 2,100 Angstroms. Note that the first dielectric layer bulges out at the upper vertical edges of the first metal lines as indicated by 41. The bulges 41 form breadloaf shapes that are herein called overhangs. The overhangs are formed due to mass transport phenomenon in the silane gas and are typical to this process.

The thickness of the first dielectric 40 must scale with the spacing S1 of the first metal lines 32. For example, if the metal spacing is about 0.5 microns, the first dielectric should be about 2000 Angstroms. If the spacing were progressively reduced to 0.25 microns, 0.18 microns, and 0.1 microns, then the first dielectric thickness would need to scale down to about 1000 Angstroms, 750 Angstroms, and 500 Angstroms, respectively. This scaling is essential so that there is adequate space between the vertical overlays of the first dielectric layer to form the desired SOG air voids.

Recalling now the prior art method, it is typical at this point in the metal isolation process to form a SOG layer overlying the first dielectric layer. In the present invention, this SOG layer is formed in a specific method that is a key to the invention. First, the SOG deposition is performed in an environment that is saturated with water. Due to the presence of a water rich, or pseudo-water layer, air voids will form in the SOG layer between closely spaced metal runners during deposition. During the baking and curing process, these air voids become permanent and reduce the capacitive coupling between the metal runners.

Figure 8:
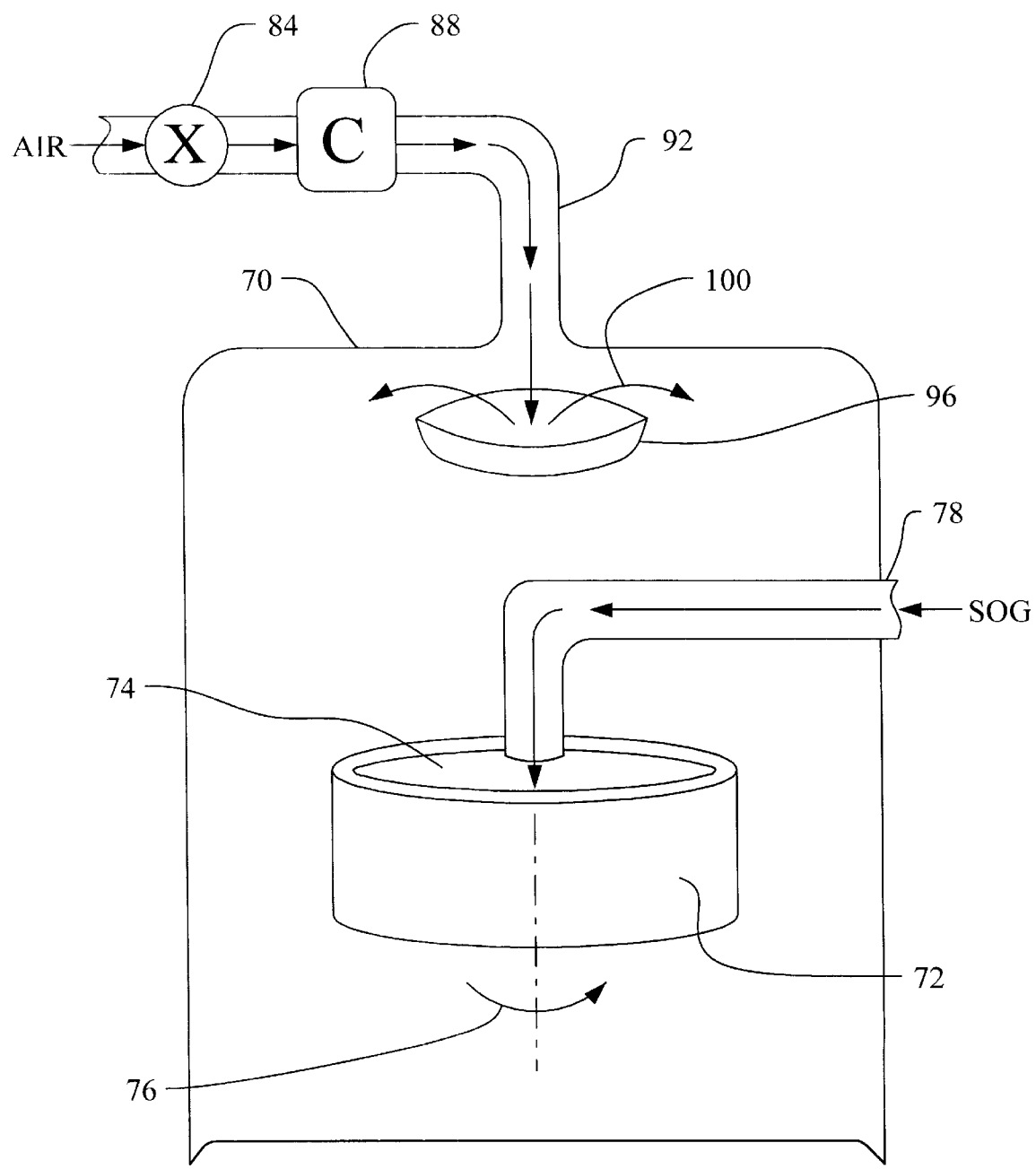
FIG. 8 schematically illustrates a representation of the mini-environment of a SOG coater in the preferred embodiment of the present invention.

Referring now to FIG. 8, the mini-environment 70 of the SOG coater is illustrated. As is conventional in the art, the coater equipment used in this process utilizes a wafer chuck 72 onto which individual semiconductor wafers 74 are automatically placed for deposition of the SOG material. The chuck spins 76 rapidly to facilitate the formation of a relatively planar surface on the SOG coating material dispensed onto the wafer 79. In the closed mini-environment, the equipment provides for the introduction of gas into the chamber through an inlet tube 92.

In the preferred embodiment of the present invention, cleanroom air is pumped into the mini-environment through an inlet tube 92. The flow rate of the inlet air is controlled 84 to a rate of between about 0.08 meters/second and 0.1 meters/second. The humidity of the inlet air is also conditioned 88 to between about 44% and 46% relative humidity. In addition, the air temperature of the mini environment is controlled to between about 23 degrees C. and 26 degrees C. Once the air leaves the inlet tube, it is directed to a deflector cup 100 to disperse the air throughout the mini-environment.

Control of the relative humidity of the inlet air is especially important in the present invention method. Experimental data shows that a relative humidity of less than about 42% will not cause the desired formation of voids in the SOG material. In addition, a relative humidity of greater than 46% is not practical for the machine.

Once the desired conditions are established, the mini-environment 70 is typically stabilized for about 1 hour to insure repeatable results. Each wafer 74 is then automatically indexed to the wafer chuck 72. After a wait time of between about 5 seconds and 15 seconds, the high water content of the mini environment will cause a pseudo-water condition on the surface of the first dielectric layer 40.

Figure 5:
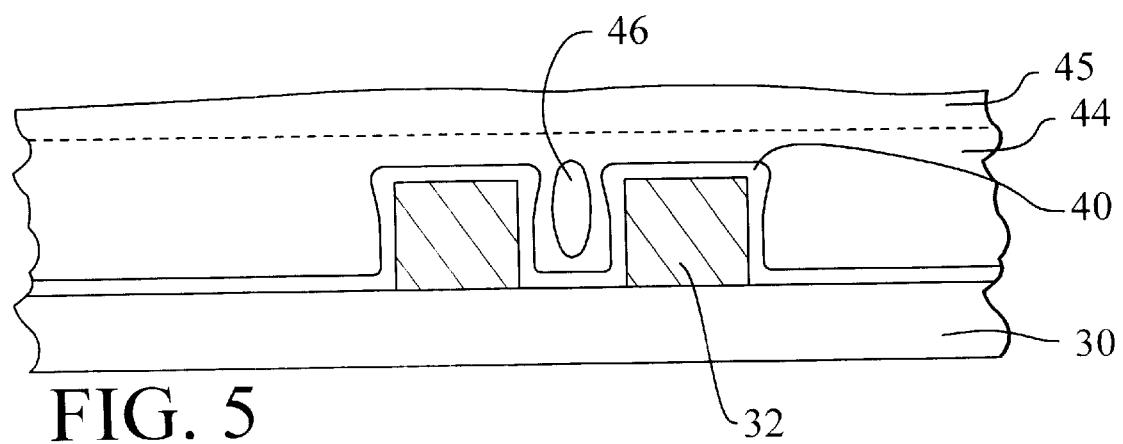

Referring now to FIG. 5, while the wafers remain in the controlled atmosphere of the mini-environment, a conventional SOG coating 44 is dispensed overlying the first dielectric layer 40. In the preferred embodiment, this SOG material is Allied Signal 314 Siloxane-based coating. A layer of SOG is deposited to a thickness of between about 3,150 Angstroms and 3,300 Angstroms. Due to the pseudo-water condition induced by the high water content of the mini environment, air voids 46 will form in the SOG layer between closely spaced metal runners. The wafers are then hard baked at a temperature of between about 80 degrees C. and 250 degrees C. for between about 300 seconds and 400 seconds. During the baking process, the voids 46 become permanent features in the SOG layer.

A second coating of SOG 45 may be deposited if desired. The second coating of SOG is required to facilitate an etch-back planarization process but is not essential to the present invention. The wafers are returned to the SOG mini-environment with the same controlled humidity and airflow conditions. The second coating of SOG 45 is typically deposited to a thickness of between about 3,150 Angstroms and 3,300 Angstroms. If the second coating of SOG 45 is used, a combined SOG layer 44 and 45 is formed. The total thickness of the combined SOG layer 44 and 45 is between about 6,300 Angstroms and 6,450 Angstroms.

The wafers are hard baked at a temperature of between about 80 degrees C. and 250 degrees C. for between about 300 seconds and 400 seconds. Curing of the SOG layer 44 is performed as is conventional in the art. The curing stabilizes the SOG layer 44 and makes etching more uniform.

Figure 6:
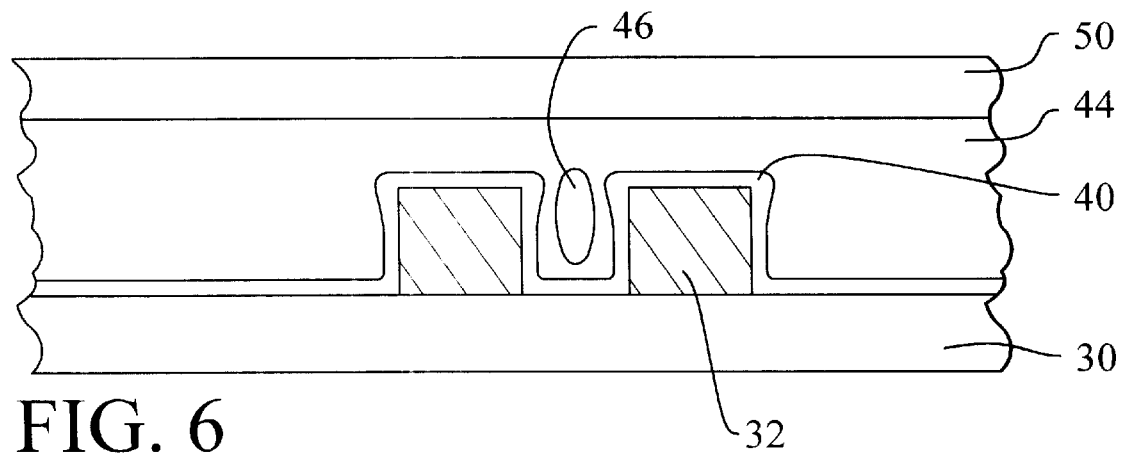

Referring now to FIG. 6, the SOG layer 44 is now etched back to planarize the surface prior to the deposition of the second dielectric layer 50. The SOG layer 44 can be etched, for example, by using an anisotropic etch process. The anisotropic etch process can be performed in a RIE oxide etcher for good control of selectivity and planarization. If the second coating of SOG 45 is used, the combined SOG layer 44 and 45 is etched back at this step and is shown in FIGS. 6 and 7 as, simply, combined SOG layer 44.

After the SOG layer 44 is etched back, a second dielectric layer 50 is deposited overlying the SOG layer 44. The second dielectric layer 50 is a PEOX and can be formed by PECVD or plasma enhanced TEOS oxide. The second dielectric layer 50 is preferably formed by a PECVD technique using silane and nitrogen dioxide gas. The second dielectric layer 50 is formed to a thickness of between about 5,000 Angstroms and 5,100 Angstroms.

Figure 7:
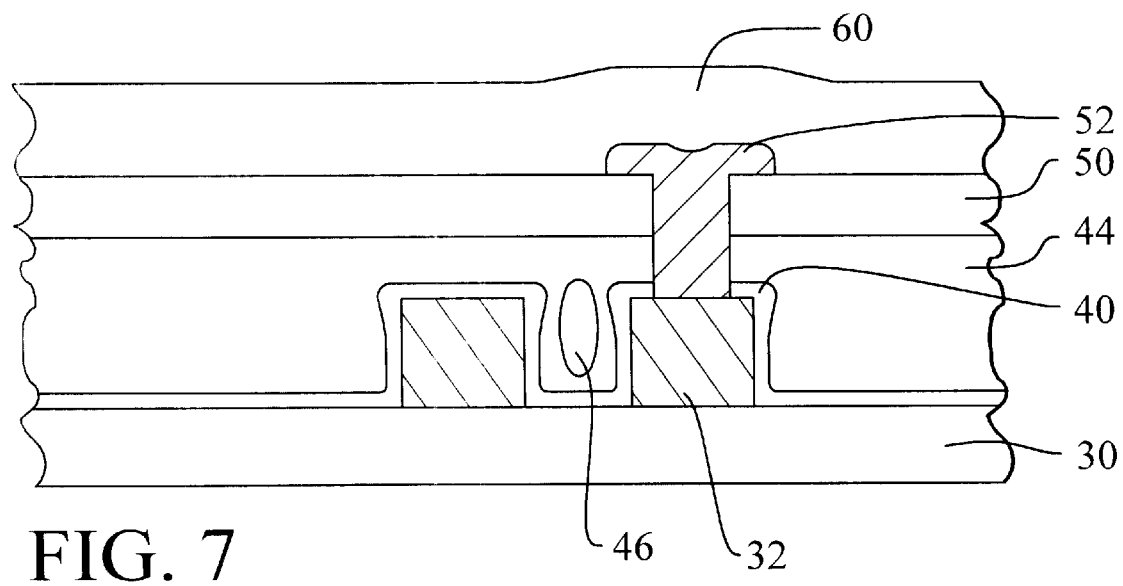

Referring now to FIG. 7, processing continues as is conventional in the art to complete the integrated circuit device. For example, via openings are etched through the second dielectric layer 50, the SOG layer 44, and the first dielectric layer 40. A second metal layer 52 is deposited overlying the second dielectric and filling the via openings. The second metal layer 52 is etched to make conductive traces as needed. A passivation layer 60 is deposited overlying the surface to complete the integrated circuit device.

As has been shown in the preferred embodiment and confirmed by experimental data, this novel approach to the formation of voids in an inter-metal dielectric layer between narrowly-spaced adjacent conductive lines reduces capacitive coupling while using conventional SOG materials and equipment. The process of the present invention provides a very manufacturable process.

While the invention has been particularly shown and described with reference to the preferred embodiments thereof, it will be understood by those skilled in the art that various changes in form and details may be made without departing from the spirit and scope of the invention.

What is claimed is:

1. A method of forming voids in a spin-on-glass layer between narrowly spaced metal lines on a substrate in an integrated circuit device comprising:

forming said narrowly spaced metal lines on said substrate surface;

depositing a dielectric layer overlying said metal lines and said substrate surface;

depositing a spin-on-glass layer overlying said dielectric layer wherein said depositing is performed in a high water content environment such that voids form in said spin-on-glass layer between said narrowly spaced metal lines and wherein said high water content environment comprises a relative humidity of between about 44% and 46%;

baking said spin-on-glass layer; and completing said integrated circuit device.

2. The method according to claim 1 wherein said narrowly spaced metal lines are spaced not more than about 0.5 microns apart.

3. The method according to claim 1 wherein said narrowly spaced metal lines are formed to a thickness of between about 4,000 Angstroms and 4,100 Angstroms.

4. The method according to claim 1 wherein said dielectric layer is a plasma enhanced oxide deposited to a thickness of between about 1,900 Angstroms and 2,100 Angstroms.

5. The method according to claim 1 wherein said high water content environment comprises an airflow rate between about 0.08 meters/second and 0.1 meters/second.

6. The method according to claim 1 wherein said spin-on-glass layer is deposited to a thickness of between about 3,150 Angstroms and 3,300 Angstroms.

7. The method according to claim 1 wherein said spin-on-glass layer is baked at a temperature of between about 80 degrees C. and 250 degrees C. for a time of between about 300 seconds and 400 seconds.

8. A method of forming voids in a spin-on-glass layer between narrowly spaced first metal lines on a substrate of a integrated circuit device comprising:

forming said narrowly spaced first metal lines on said substrate surface;

depositing a first dielectric layer overlying said first metal lines and said substrate surface;

depositing a first spin-on-glass layer overlying said dielectric layer wherein said depositing is performed in a high water content environment such that voids form in said first spin-on-glass layer between said narrowly spaced metal lines;

baking said first spin-on-glass layer;

depositing a second spin-on-glass coating overlying said first spin-on-glass coating and thereby forming a combined spin-on-glass layer comprised of said first and said second spin-on-glass coatings;

baking and curing said combined spin-on-glass layer;

etching back said combined spin-on-glass layer to planarize top surface of said combined spin-on-glass layer;

depositing a second dielectric layer overlying said combined spin-on-glass layer;

etching vias through said second dielectric layer, said combined spin-on-glass layer and said first dielectric layer to top surface of said first metal lines;

depositing a second metal layer overlying said second dielectric layer;

etching said second metal layer to define desired features;

depositing a passivation layer overlying said second metal layer and said second dielectric layer; and completing said integrated circuit device.

9. The method according to claim 8 wherein said narrowly spaced first metal lines are spaced not more than about 0.5 microns apart.

10. The method according to claim 8 wherein said narrowly spaced first metal lines are formed to a thickness of between about 4,000 Angstroms and 4,100 Angstroms.

11. The method according to claim 8 wherein said first dielectric layer is a plasma enhanced oxide deposited to a thickness of between about 1,900 Angstroms and 2,100 Angstroms.

12. The method according to claim 8 wherein said high water content environment comprises a relative humidity of between about 44% and 46% and an airflow rate between about 0.08 meters/second and 0.1 meters/second.

13. The method according to claim 8 wherein said first spin-on-glass coating is deposited to a thickness of between about 3,150 Angstroms and 3,300 Angstroms.

14. The method according to claim 8 wherein said first spin-on-glass coating is baked at a temperature of between about 80 degrees C. and 250 degrees C. for a time of between about 300 seconds and 400 seconds.

15. The method according to claim 8 wherein said second spin-on-glass coating is deposited to a thickness of between about 3,150 Angstroms and 3,300 Angstroms.

16. A method of forming voids in a spin-on-glass layer between narrowly spaced first metal lines on a substrate of a integrated circuit device comprising:

forming said narrowly spaced first metal lines on said substrate surface wherein said first metal lines are spaced not more than about 0.5 microns apart;

depositing a first dielectric layer overlying said first metal lines and said substrate surface;

depositing a first spin-on-glass layer overlying said dielectric layer wherein said depositing is performed in a high water content environment comprising a relative humidity of between about 44% and 46% and an airflow rate of between about 0.08 meters/second and 0.1 meters/second such that voids form in said first spin-on-glass layer between said narrowly spaced metal lines;

baking said first spin-on-glass layer;

depositing a second spin-on-glass coating overlying said first spin-on-glass coating and thereby forming a combined spin-on-glass layer comprised of said first and said second spin-on-glass coatings;

baking and curing said combined spin-on-glass layer;

etching back said combined spin-on-glass layer to planarize top surface of said combined spin-on-glass layer;

depositing a second dielectric layer overlying said combined spin-on-glass layer;

etching vias through said second dielectric layer, said combined spin-on-glass layer and said first dielectric layer to top surface of said first metal lines;

depositing a second metal layer overlying said second dielectric layer;

etching said second metal layer to define desired features;

depositing a passivation layer overlying said second metal layer and said second dielectric layer; and completing said integrated circuit device.

17. The method according to claim 16 wherein said narrowly spaced first metal lines are formed to a thickness of between about 4,000 Angstroms and 4,100 Angstroms.

18. The method according to claim 16 wherein said first dielectric layer is a plasma enhanced oxide deposited to a thickness of between about 1,900 Angstroms and 2,100 Angstroms.

19. The method according to claim 16 wherein said first spin-on-glass coating is deposited to a thickness of between about 3,150 Angstroms and 3,300 Angstroms.

20. The method according to claim 16 wherein said second spin-on-glass coating is deposited to a thickness of between about 3,150 Angstroms and 3,300 Angstroms.

* * * * *